US009502632B2

(12) United States Patent
Hielscher et al.

(10) Patent No.: US 9,502,632 B2
(45) Date of Patent: Nov. 22, 2016

(54) RESONATOR FOR THE DISTRIBUTION AND PARTIAL TRANSFORMATION OF LONGITUDINAL VIBRATIONS AND METHOD FOR TREATING AT LEAST ONE FLUID BY MEANS OF A RESONATOR ACCORDING TO THE INVENTION

(75) Inventors: Harald Hielscher, Stahnsdorf (DE); Holger Hielscher, Teltow (DE); Thomas Hielscher, Potsdam (DE)

(73) Assignee: Dr. Hielscher GmbH, Teltow (DE)

( * ) Notice: Subject to any disclaimer, the term of this patent is extended or adjusted under 35 U.S.C. 154(b) by 412 days.

(21) Appl. No.: 14/117,990

(22) PCT Filed: May 16, 2012

(86) PCT No.: PCT/EP2012/059188

§ 371 (c)(1),
(2), (4) Date: Nov. 15, 2013

(87) PCT Pub. No.: WO2012/156475

PCT Pub. Date: Nov. 22, 2012

(65) Prior Publication Data

US 2014/0184025 A1 Jul. 3, 2014

Related U.S. Application Data

(60) Provisional application No. 61/486,823, filed on May 17, 2011.

(51) Int. Cl.
*H01L 41/09* (2006.01)
*H01L 41/04* (2006.01)
*B06B 3/00* (2006.01)

(52) U.S. Cl.
CPC *H01L 41/04* (2013.01); *B06B 3/00* (2013.01)

(58) Field of Classification Search
USPC .......................................... 310/311-371, 26
See application file for complete search history.

(56) References Cited

U.S. PATENT DOCUMENTS 2,490,452 A * 12/1949 Mason .................... G01H 1/10 310/334
2,514,080 A * 7/1950 Mason ..................... B06B 3/00 310/15
3,029,766 A * 4/1962 Jones ....................... B23K 1/06 118/57

(Continued)

FOREIGN PATENT DOCUMENTS

DE 3328614 12/1984

OTHER PUBLICATIONS

International Search Report mailed on Feb. 18, 2013 in international Application No. PCT/EP2012/059188. (8 pages).

*Primary Examiner* — Thomas Dougherty
(74) *Attorney, Agent, or Firm* — Fox Rothschild LLC; Robert J. Sacco; Carol E. Thorstad-Forsyth

(57) ABSTRACT

The invention relates to a resonator for the distribution and partial transformation of longitudinal vibrations and to a method for treating at least one fluid by means of a resonator according to the invention. The resonator is designed for the distribution of longitudinal vibrations and the partial transformation thereof into longitudinal vibrations that are superimposed by vibrations oriented towards the center of gravity or approximately towards the center of gravity of a cross-sectional surface of at least one opening of the resonator. The resonator comprises a natural number of parallel elements of at least lambda/2 or a natural multiple thereof, at least one of the lambda/2 elements comprising at least one opening suitable for transmitting the transformed vibrations to a fluid located inside the opening.

12 Claims, 5 Drawing Sheets

(56) References Cited

U.S. PATENT DOCUMENTS

Figure 1:
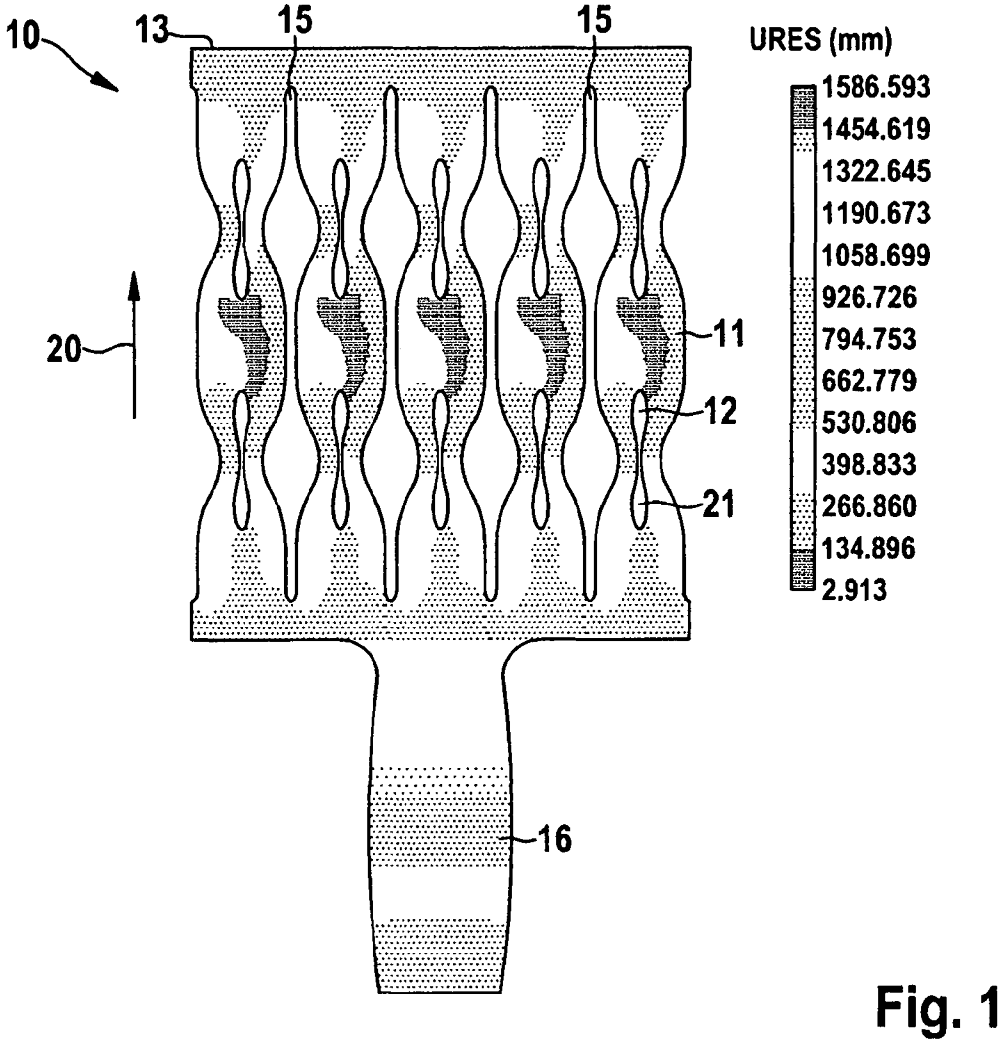

| | | | | |
|---|---|---|---|---|
| 3,584,327 | A * | 6/1971 | Murry | G10K 11/24 15/104.16 |
| 5,384,508 | A | 1/1995 | Vaxelaire | |
| 5,940,347 | A * | 8/1999 | Raida | G10K 11/24 367/138 |
| 5,945,642 | A | 8/1999 | Nayar et al. | |
| 6,361,747 | B1 * | 3/2002 | Dion | B01J 19/10 310/334 |
| 2005/0271559 | A1 * | 12/2005 | Ratcliff | B01D 17/00 422/128 |
| 2009/0079300 | A1 | 3/2009 | Hielscher et al. | |
| 2011/0018368 | A1 * | 1/2011 | Hirnschal | B06B 3/00 310/26 |

* cited by examiner

RESONATOR FOR THE DISTRIBUTION AND PARTIAL TRANSFORMATION OF LONGITUDINAL VIBRATIONS AND METHOD FOR TREATING AT LEAST ONE FLUID BY MEANS OF A RESONATOR ACCORDING TO THE INVENTION

CROSS REFERENCE TO RELATED APPLICATIONS

This application is a §371 national stage entry of International Application No. PCT/EP2012/059188, filed on May 16, 2012 and entitled "Resonator for the Distribution and Partial Transformation of Longitudinal Vibrations and Method for Treating at Least One Fluid by Means of a Resonator According to the Invention", which claims priority to U.S. Provisional Application No. 61/486,823, filed on May 17, 2011, the entireties of which are incorporated herein by reference.

The present invention relates to a resonator for distributing and partially transforming longitudinal oscillations and a method of treating at least one fluid with a resonator according to the invention.

The invention thus relates to an apparatus and a method for transforming low-frequency power ultrasonic oscillations (NFLUS oscillations) by using a new type of oscillation geometry. This geometry allows a transformation and distribution of longitudinal oscillations in a resonator into longitudinal oscillations, on which additional oscillations are superimposed.

Low-frequency high-power ultrasound (NFLUS) is ultrasound with an operating frequency of 15 to 100 kHz, preferably 15 to 60 kHz, e.g. 30 kHz, and acoustic power above 5 W, preferably 10 W to 1000 W, for example 200 W. For example, piezoelectric or magnetostrictive systems are used to produce the ultrasound. Linear transducers and flat or curved plate oscillators or tubular resonators are known in the art. Low frequency high-power ultrasound is widely applied in the treatment of liquids, such as food, cosmetics, paints and nanomaterials. For this purpose, ultrasound is transmitted directly or indirectly into liquids with amplitudes from 1 to 350 μm, preferably 5 to 50 μm, for example, 15 μm. Lambda is here the wavelength resulting from the NFLUS frequency and the sound propagation velocity in the resonator.

A resonator may have one or more Lambda/2 elements.

Aside from the treatment of samples in open systems, for example in a beaker, many applications require the introduction of NFLUS into reactor vessels. Depending on the application, the reactor vessel may have a lower pressure or a higher pressure than ambient pressure. A lower pressure (reduced pressure) is between vacuum (0 bar absolute) and ambient pressure (e.g. 1 bar absolute), for example at 0.5 bar. A higher pressure (overpressure) is present when the pressure is above ambient pressure. Some systems use an internal vessel pressure between 1.5 bar absolute and 1000 bar absolute, for example 3 bar absolute.

To introduce NFLUS into such vessel, oscillations may either be initiated in the vessel wall by an externally mounted NFLUS system or an NFLUS transducer may be installed entirely in the interior of the pressurized vessel. Alternatively, the acoustic transducers, for example a linear piezoelectric transducer, may be located outside of the vessel and the oscillations be transmitted via one or more resonators into the vessel interior.

It is an object of the invention to provide a resonator and a method for treating at least one fluid, wherein fluids can be treated with oscillations in a simple and efficient manner.

According to the invention, the object is attained with the resonator and the method for treating at least one fluid as described in the independent claims of the present disclosure. Advantageous embodiments of the resonator are the subject matter of the dependent claims.

A resonator is provided which is suitable for distributing and partially transforming longitudinal oscillations into longitudinal oscillations, on which oscillations that are directed toward the centroid or approximately toward the centroid of a cross-sectional area of at least one opening encompassed by the resonator are superimposed. The resonator has a natural number of parallel elements of at least Lambda/2 or a natural multiple thereof, wherein at least one of the Lambda/2 elements has at least one opening which is configured to transmit the transformed oscillations to a fluid disposed the opening.

Lambda is here the wavelength.

For a better understanding of the invention, an element of at least Lambda/2 or a natural multiple thereof will be referred to hereinafter as Lambda/2 element.

In other words, the resonator may include n Lambda/2 elements arranged in parallel, wherein instead of the parallel arrangement of only a single Lambda/2 element an integer multiple m of Lambda/2 elements may be arranged in parallel, such as at m=2, wherein n elements with a length of 2-Lambda/2 are arranged in parallel.

The term "approximate direction toward the centroid" is preferably meant to indicate that a deviation of up to 30°, preferably of up to 15° and in particular up to 10° from the direct the direction of the oscillation toward the centroid is permitted.

When the opening is formed by a borehole, the transformed oscillation is then oriented radially or at least approximately radially toward the center of the borehole.

Preferably, the transformed oscillation is directed precisely toward the centroid of the opening or exactly radially to the center of the borehole.

The opening may be arranged as a through-hole or as a slot and may therefore pass through the resonator, or the opening may just be a recess or a concavity in the resonator, such as e.g. a blind hole or a groove-shaped depression.

The resonator may include a total of 2n Lambda/2 elements (or an integer multiple thereof), or 2n+1 Lambda/2 elements (or an integer multiple thereof), wherein n is a natural number.

Preferably, each Lambda/2 element should have at least two openings.

The Lambda/2 elements may be separated from each other by slots along a portion of their longitudinal extent.

In an advantageous embodiment, the resonator has at least one Lambda/2 element which is suitable for reducing or increasing the amplitude of the oscillations present at the other Lambda/2 elements.

The cross-section of at least one opening may be a polygon.

In a preferred embodiment of the resonator, the oscillation directed toward the centroid or approximately toward the centroid of a cross-sectional area of at least one opening has at least two oscillation nodes on the inside of the opening.

Furthermore, the resonator may have at least one opening disposed on an end face and configured to influence at least one of the resonance frequencies of the resonator.

The end face is here a side surface of the resonator extending substantially or exactly perpendicular to the propagation direction of the longitudinal oscillations.

The resonator is preferably manufactured from a steel alloy, an aluminum alloy, a titanium alloy, from ceramic or from a glass.

The resonator should be designed for distributing and partially transforming ultrasound having a frequency between 15 kHz and 40 kHz, in particular a frequency between 16 kHz and 22 kHz.

The resonator should also be designed for distributing and partially transforming ultrasound having a power between 10 W and 20,000 W, in particular a power between 50 W and 1000 W.

The maximum diagonal dimension of the opening arranged for transferring the oscillations to the fluid is preferable between 1 mm and 100 mm.

The maximum amplitude of the oscillations in the longitudinal direction should be less than 30 μm (peak-peak) and greater than 1 μm (peak-peak), preferably greater than 5 μm (peak-peak).

A particularly advantageous design of the resonator includes a vessel in at least one opening, wherein the opening holds the vessel with a substantially positive fit.

Preferably, the opening holds the vessel entirely positively.

Alternatively, at least one inside surface of the opening may at least in part positively abut a vessel wall.

Also provided is a method according to the invention for treating at least one fluid with a resonator according to the invention, wherein longitudinal oscillations are distributed and partially transformed into oscillations directed toward the centroid or approximately toward the centroid of a cross-sectional area of an at least one opening encompassed by the resonator, on which longitudinal oscillations are superimposed, wherein the transformed oscillations are transferred to a fluid disposed in the opening, and wherein the volume of the fluid in the opening is delimited by a vessel, or wherein the volume of the fluid in the opening is delimited by the wall of the opening.

Preferably, the longitudinal oscillations, on which the oscillations directed approximately toward the centroid of a cross-sectional area of an at least one opening encompassed by the resonator are superimposed, are also transferred to the fluid.

The oscillations are distributed to one or more openings or vessels arranged at that location, where they are transferred to the fluid disposed therein.

The fluid may be a gas as well as a liquid or a two-phase mixture.

A resonator formed of several Lambda/2 elements may be manufactured from a single piece of material of appropriate length, or may be assembled from several elements having the length m*Lambda/2 (n∈N), for example by screwing, welding, gluing, or pressing. Lambda/2 elements may have various cross-sectional material geometries, for example, circular, oval or rectangular cross-sections. The cross-sectional geometry and cross-sectional area may vary along the longitudinal axis of a Lambda/2 element. Lambda/2 elements may be manufactured, inter alia, from metal or ceramic materials or from glass, in particular from titanium, titanium alloys, steel or steel alloys, aluminum or aluminum alloys, for example from titanium grade 5.

To introduce NFLUS into a vessel from the outside, oscillation may be transmitted to the vessel contents via the vessel wall. The transmission of oscillations to the vessel wall may take place on all sides and enclosing the entire vessel wall, or only over a part of the vessel wall. This part may, for example, surround the cross-section of the vessel. The oscillations may act at different angles from the resonator to the vessel wall, such as nearly or completely perpendicular. In the case of a round or elliptical cross-section, the radial oscillations may act on the vessel cross-section. In the case of a polygonal, polygonal cross section, the oscillation may be directed radially to a point within the vessel cross-section, preferably toward the centroid of the cross-sectional area of the vessel.

For the resonator to be able to enclose a vessel, the cross-section of the opening of the resonator must match the cross-section of the vessel and have at least one point of contact, preferably at least two points of contact, with the cross-section of the vessel. At least one of these points of contact should preferably be located outside of an oscillation minimum of the resonator.

With the inventive design of the resonator, which preferably includes a plurality of Lambda/2 elements interconnected at the maxima of the longitudinal oscillations and has openings in the Lambda/2 elements, longitudinal oscillations acting on one or more of these Lambda/2 elements may be transformed into oscillations directed toward the centroid or approximately toward the centroid of a cross-sectional area at least one opening encompassed by the resonator, on which longitudinal oscillations are then superimposed.

Characteristic for the design of the resonator according to the invention are the openings introduced into at least one, preferably all of the Lambda/2 elements, such as boreholes, milled sections or slots, or recesses introduced on one or more sides. One or more openings or recesses may here be incorporated in one or more Lambda/2 elements.

The resonance frequencies of the resonator and the amplitude distribution along the cross-sectional lines of the openings are dependent, inter alia, on the outside geometry and the opening cross-sectional geometry. The resonant frequencies of the resonator and the amplitude distribution along the cross-sectional lines of the openings can be additionally influenced by incorporating the openings or recesses in the resonator according to the invention.

Figure 2:
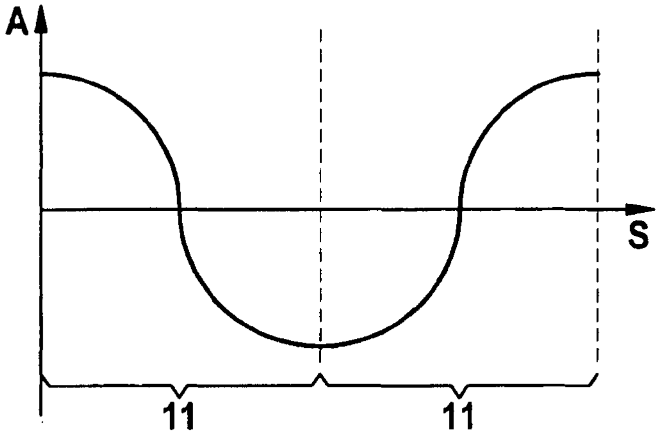
Figure 4:
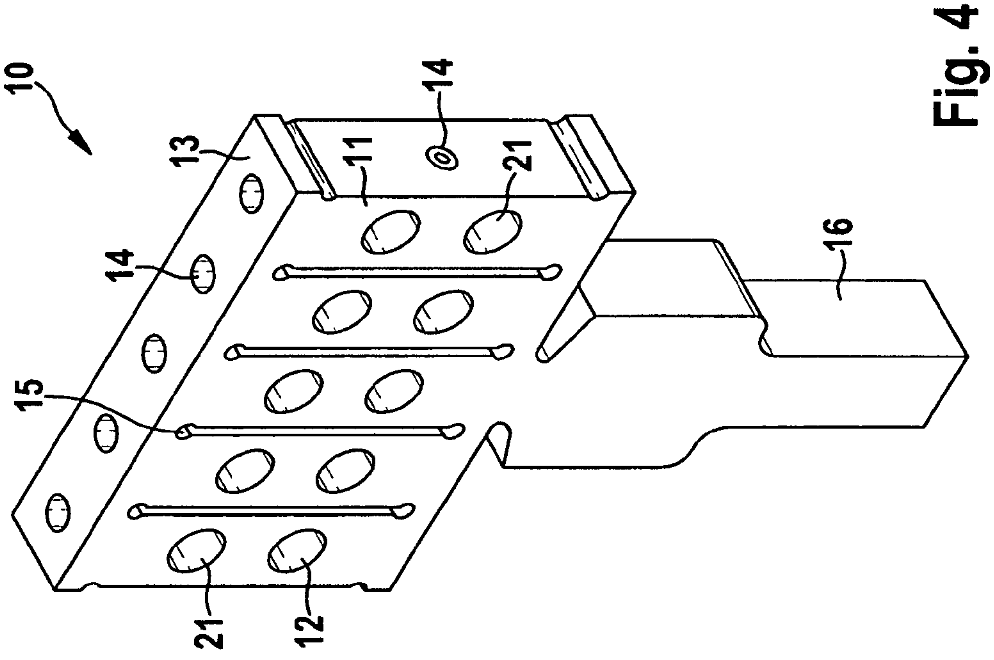
Figure 3:
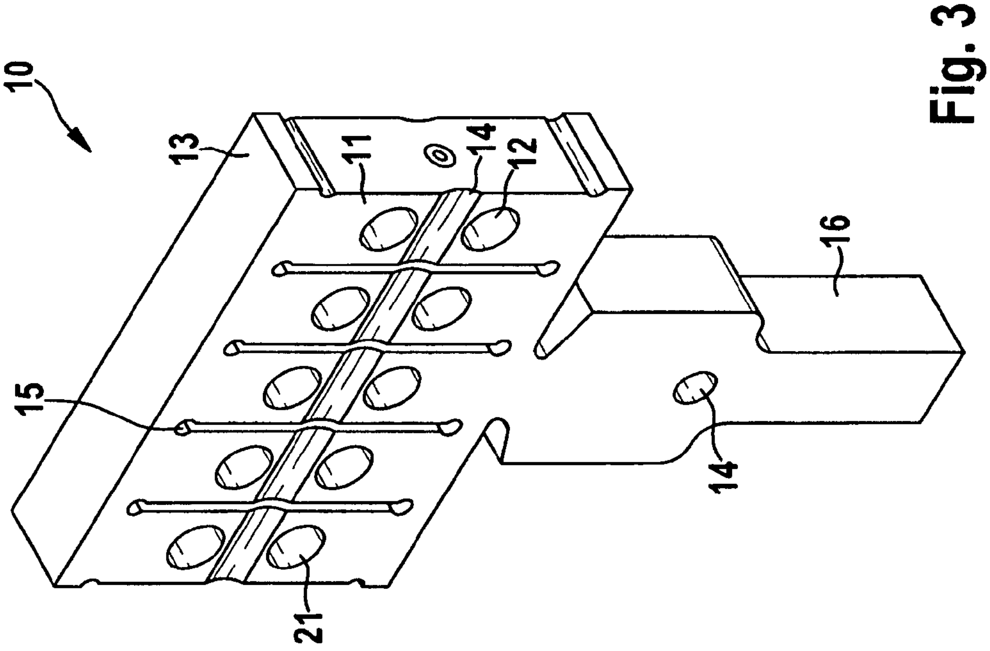
Figure 5:
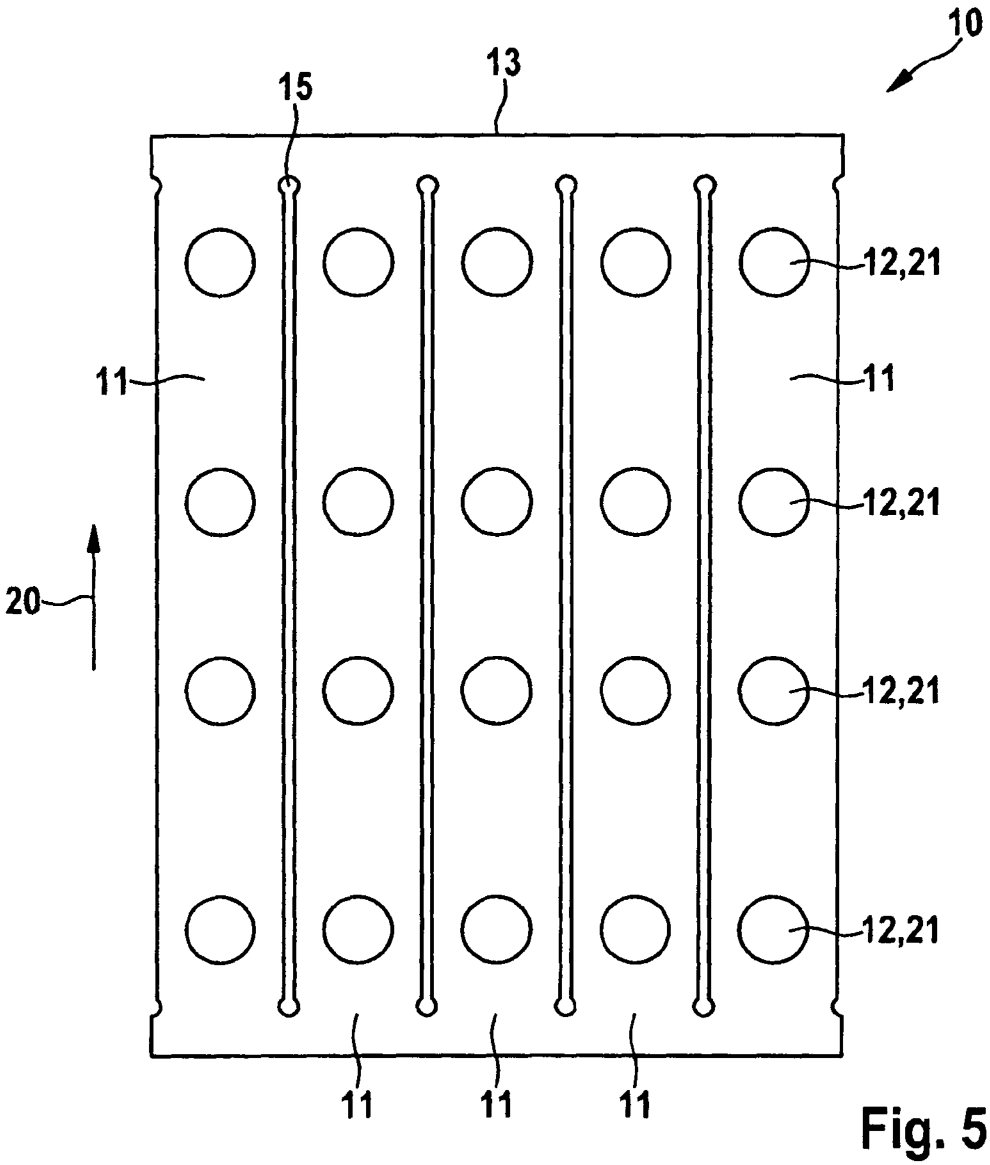
Figure 6:
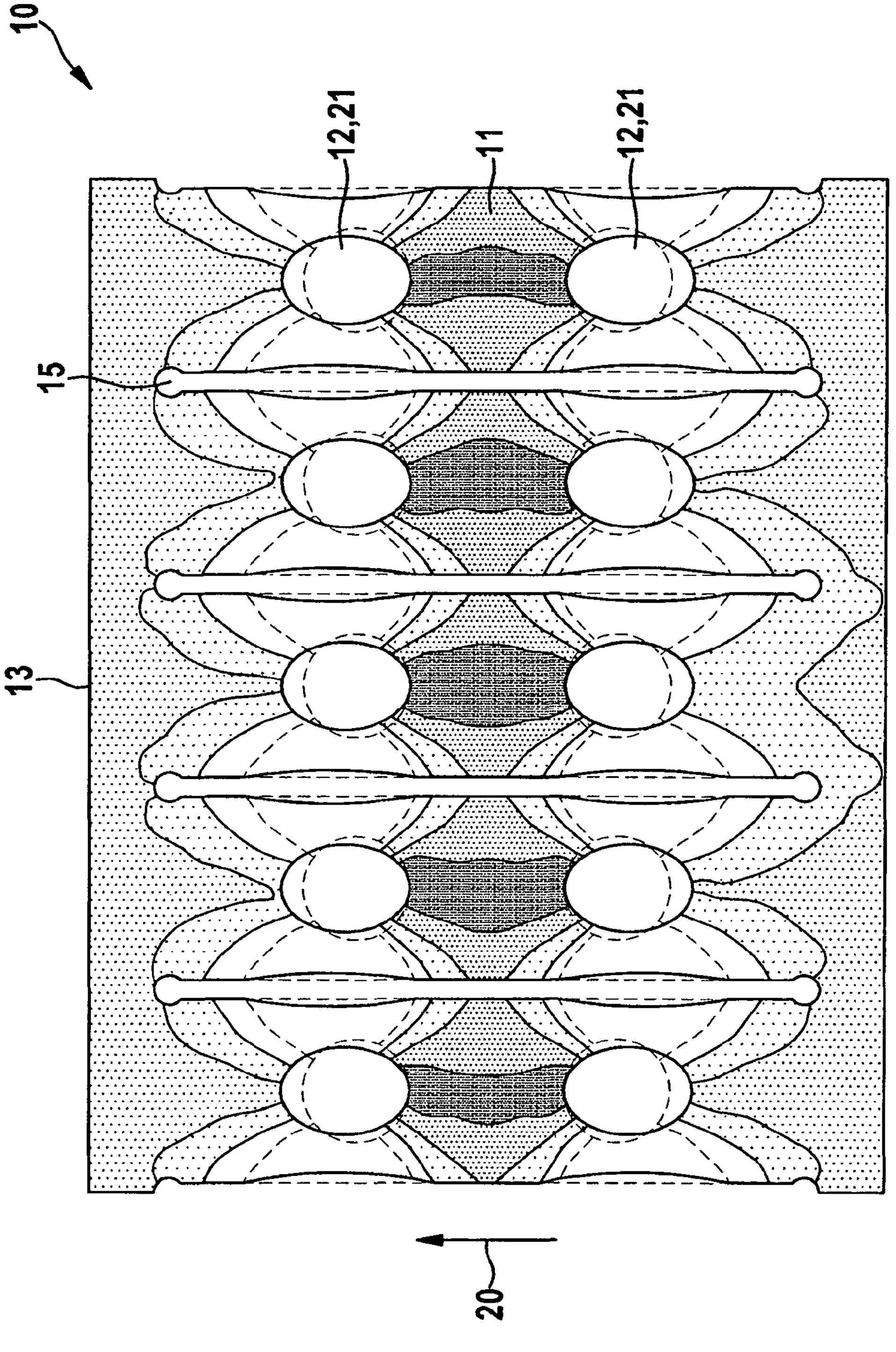
Figure 7:
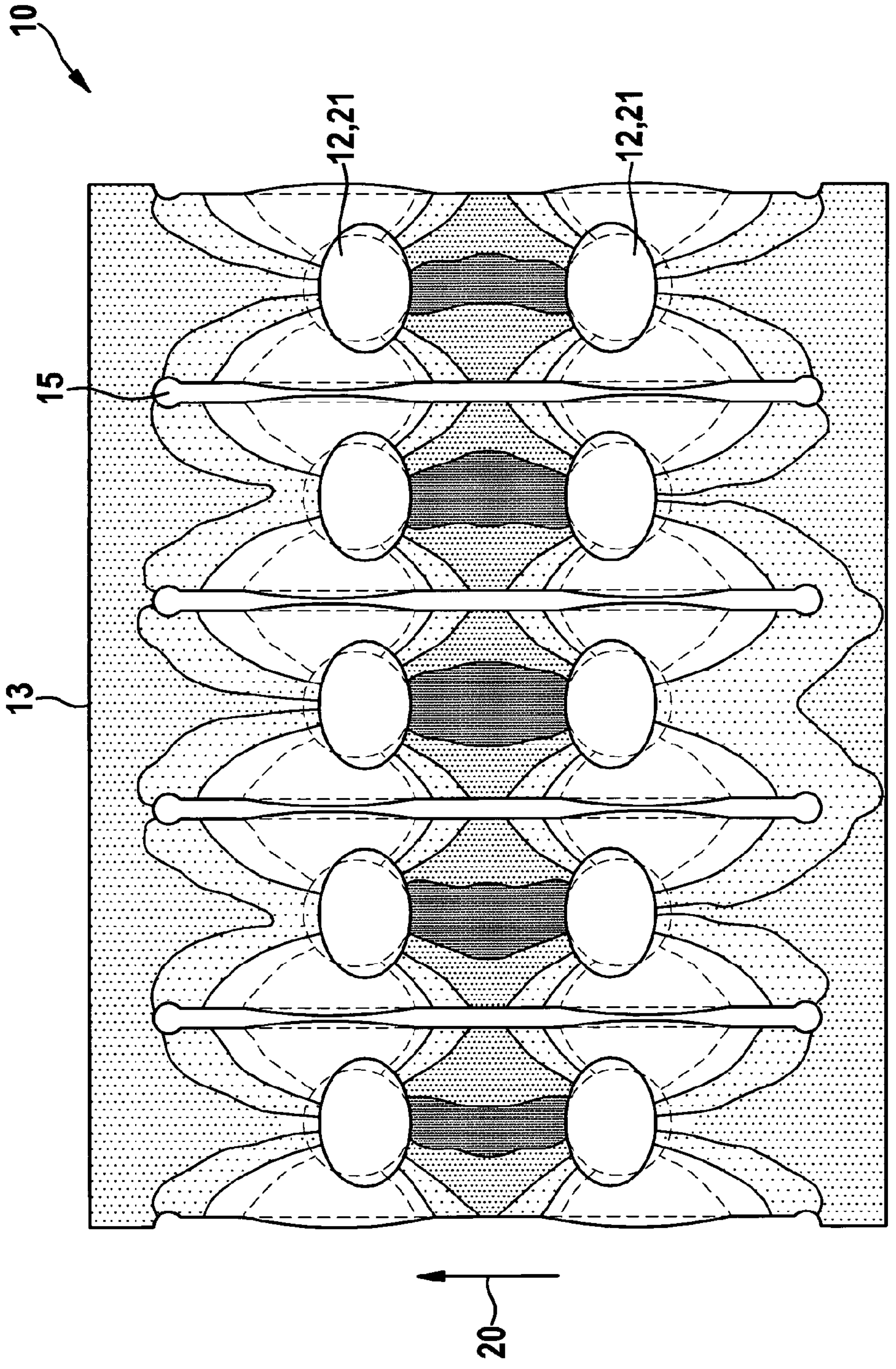

The invention will now be explained in more detail with reference to exemplary embodiments illustrated in the accompanying drawings, wherein:

FIG. 1 shows a resonator according to the invention in an operating state for illustrating the amplitude distribution, FIG. 2 shows a diagram of the amplitude changes in the oscillations, FIG. 3 shows a resonator according to the invention in a first embodiment, FIG. 4 shows a resonator according to the invention in a second embodiment, FIG. 5 shows a resonator according to the invention in a third embodiment, FIG. 6 shows a diagram of the resonator of FIG. 5 in a first oscillatory state, FIG. 7 shows a diagram of the resonator of FIG. 5 in a second oscillatory state.

The resonator 10 according to the invention, as shown in FIG. 1, includes Lambda/2 elements n, wherein n=5 in the resonator 10 illustrated in FIG. 1. The individual Lambda/2 elements 11 are separated by slots 15. However, they are connected to each other on the side of the shaft 16 and on the front side 13. At least one opening 12 is provided in each Lambda/2 element 11, with two openings 12 being arranged in the embodiment shown in FIG. 1. The fluid 21 to be treated is disposed in these openings 12 in vessels (not illustrated in detail) or without a vessel, in which case the fluid 21 is received in the opening 12. The openings 12 may pass through the respective Lambda/2 element 11 or may be present in the respective Lambda/2 element as a recess 11.

The resonator shown in FIG. 1 is not shown to scale in the oscillatory state. The openings 12 are much more compact in the idle state, i.e. when the resonator 10 is unloaded, as can be seen for example from FIGS. 3 to 5.

The resonator 10 is not limited to the embodiments shown in FIGS. 1, 3 and 4 with Lambda/2 elements 11 having each only two openings 12; instead, m Lambda/2 elements may be arranged in parallel, as illustrated for example in FIG. 5, wherein m=2. This means that m is the integer number of Lambda/2 of the respective element in the propagation direction of the longitudinal oscillations.

Preferably, two openings 12 are arranged in each Lambda/2 element 11.

The shading shown in FIG. 1 and the corresponding shading in the scale shown on the right next to the resonator 10, which represents the amplitude distribution URES in mm, shows the regions of the Lambda/2 elements 11 in which extreme amplitudes occur.

FIG. 2 shows a diagram illustrating the distribution of the amplitudes A along the length of two Lambda/2 elements 11. It is apparent that extreme values occur in the end regions of each Lambda/2 element 11.

FIGS. 3 and 4 show two different embodiments of a resonator 10 according to the invention. The resonator 10 illustrated in FIG. 3 includes in a shaft 16 additionally a resonance-influencing element 14 in the form of an additional opening, and as another resonance-influencing element 14 a groove-shaped recess 11 extending across the parallel Lambda/2 elements. These resonance-influencing elements 14 are used to adjust the resonance characteristic of the resonator 10.

To influence the resonance characteristic, the resonator 10 illustrated in FIG. 4 includes an additional resonance-influencing element 14 in form of an opening disposed on a side face of a Lambda/2 element 11, and on the end face 13 a resonance-influencing element 14 associated with each of Lambda/2 element 11 in the form of a bore.

As is apparent from FIG. 5, the resonator according to the invention may also be constructed without shaft 16. It is also apparent that the parallel elements separated by slots 15 have a length of 2*Lambda/2, wherein two openings 12 are arranged in each of the individual Lambda/2 elements 11. The slots 15 between the Lambda/2 elements 11 preferably extend in the regions of the longitudinal extent 20, where the parallel openings 12 are arranged.

A resonator according to the invention similar to the one shown in FIG. 5 is shown in the operating situations in FIGS. 6 and 7, except that the resonator 10 shown in FIGS. 6 and 7 has only Lambda/2 elements arranged parallel and having each two openings 12.

FIG. 6 shows a resonator 10 which is stretched along its length 20 due to its resonance characteristic, which is apparent in particular from the deformation of the openings 12 into an elliptical shape in a longitudinal direction 20. The contours of the openings 12, as they exist in the non-oscillatory state, are indicated by the dashed lines. The shadings indicate here also the regions of the resonator 10 where the minima and maxima of the amplitude distribution occur.

FIG. 7 shows the resonator illustrated in FIG. 6 in another oscillatory state, wherein the resonator 10 is here in a compressed state in longitudinal direction 20, as can be seen from the elliptical shape of the openings 12 perpendicular to the longitudinal direction 20.

As can be seen in particular from FIGS. 6 and 7, oscillations introduced into the resonator 10 longitudinally are transformed into oscillations acting radially from the edge of the openings 12 toward the center thereof. The fluids 21 in the openings 12 can thus be exposed such oscillations.

The invention claimed is:

1. A resonator for distributing and partially transforming longitudinal oscillations into oscillations directed toward the centroid or approximately to the centroid of a cross-sectional area of at least one opening encompassed by the resonator and superimposing the longitudinal oscillations, wherein the resonator comprises a natural number of parallel elements of a length of at least Lambda/2 or a natural multiple thereof, wherein at least one of the Lambda/2 elements has at least one opening for transmitting transformed oscillations to a fluid disposed in the opening; and wherein each Lambda/2 element has at least two openings.

2. The resonator according to claim 1, wherein the resonator comprises a total of 2n Lambda/2 elements.

3. The resonator according to claim 1, wherein the resonator comprises a total of 2n+1 Lambda/2 elements.

4. The resonator according to claim 1, wherein the Lambda/2 elements are separated from each other by slots along a portion of their longitudinal extent.

5. The resonator according to claim 1, wherein the cross-section of at least one opening is a polygon.

6. The resonator according to claim 1, wherein the resonator is made from a material selected from a list comprising a steel alloy, an aluminum alloy, a titanium alloy, from a ceramic material and from a glass.

7. The resonator according to claim 1, wherein the maximum dimension of the diagonal of the opening arranged for transferring the oscillations to the fluid is between 1 mm and 100 mm.

8. The resonator according to claim 1, which is designed such that the maximum amplitude of the oscillations in the longitudinal direction is smaller than 30 μm (peak-peak).

9. The resonator according to claim 1, which is designed such that the maximum amplitude of the oscillations in the longitudinal direction is greater than 1 μm (peak-peak).

10. The resonator according to claim 1, which is designed such that the maximum amplitude of the oscillations in the longitudinal direction is greater than 5 μm (peak-peak).

11. The resonator according to claim 1, comprising a vessel disposed in at least one opening, wherein the opening holds the vessel with a substantially positive fit.

12. A method for treating at least one fluid with a resonator according to claim 1, wherein longitudinal oscillations are distributed and partially transformed into oscillations directed at least approximately toward the centroid of a cross-sectional area of the at least one opening encompassed by the resonator, on which longitudinal oscillations are superimposed, wherein the transformed oscillations are to be transferred to a fluid disposed in the opening, and wherein i) the volume of the fluid in the opening is delimited by a vessel, or ii) the volume of the fluid in the opening is delimited by the wall of the opening.

* * * * *